United States Patent
Rozman et al.

(10) Patent No.: US 8,520,389 B2
(45) Date of Patent: Aug. 27, 2013

(54) POWER SEMICONDUCTOR MODULE FOR WIDE TEMPERATURE APPLICATIONS

(75) Inventors: Gregory I. Rozman, Rockford, IL (US); Jacek F. Gieras, Glastonbury, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 553 days.

(21) Appl. No.: 12/629,398

(22) Filed: Dec. 2, 2009

(65) Prior Publication Data
US 2011/0128707 A1 Jun. 2, 2011

(51) Int. Cl.
*H05K 7/20* (2006.01)

(52) U.S. Cl.
USPC .......................................... 361/709

(58) Field of Classification Search
USPC ................. 361/709, 230, 233, 234, 704, 707, 361/712, 720, 736, 740, 752, 753, 765, 795, 361/799; 257/659, 717
See application file for complete search history.

(56) References Cited

U.S. PATENT DOCUMENTS

| | | | |
|---|---|---|---|
| 6,159,772 A * | 12/2000 | Vinciarelli et al. | 438/115 |
| 6,245,442 B1 | 6/2001 | Towata et al. | |
| 6,310,775 B1 | 10/2001 | Nagatomo et al. | |
| 6,351,367 B1 * | 2/2002 | Mogi et al. | 361/234 |
| 6,597,063 B1 | 7/2003 | Shimizu et al. | |
| 7,078,795 B2 | 7/2006 | Bayerer et al. | |
| 7,141,310 B2 | 11/2006 | Adams et al. | |
| 7,159,310 B2 | 1/2007 | Osanai | |
| 2007/0262387 A1 | 11/2007 | Nonaka et al. | |
| 2008/0079021 A1 | 4/2008 | Bayerer et al. | |

OTHER PUBLICATIONS

Occhionero, Mark, et a., "Aluminium Silicon Carbide (AlSiC) for Cost-Effective Thermal Management and Functional Microelectronic Packaging Design Solutions," 12th European Microelectronics and Packaging Conference, Jun. 7-9, 1999, S10-04.

* cited by examiner

*Primary Examiner* — Jeremy Norris
*Assistant Examiner* — Tremesha S Willis
(74) *Attorney, Agent, or Firm* — Kinney & Lange, P.A.

(57) ABSTRACT

A power semiconductor module includes an insulating substrate with a conductive circuit layer attached to one side and a baseplate attached to the other side. A power semiconductor device is attached to the conductive circuit layer. The conductive circuit layer and the baseplate are formed of a material with a coefficient of thermal expansion less than about $8.0 \times 10^{-6}/°$ C. and a density less than about 4 g/cm$^3$.

16 Claims, 3 Drawing Sheets

US 8,520,389 B2

POWER SEMICONDUCTOR MODULE FOR WIDE TEMPERATURE APPLICATIONS

BACKGROUND

The present invention relates to a power semiconductor module. In particular, the invention relates to a power semiconductor module that may be suitably used for power conversion on an aircraft.

Power semiconductor modules are devices for converting and controlling the flow of electric energy and are used as inverters, DC/DC converters, and other power conversion devices. Power semiconductor modules are widely used in homes, industries, automobiles, aircraft, wherever power must be converted or controlled. Power semiconductor devices, including diodes, thyristors, power MOSFETS and IGBTs, are typically assembled to form power semiconductor modules, which may contain several such power semiconductor devices.

Controlling and converting power produces significant heat due to electrical losses in the power semiconductor devices. If not conducted away, this heat will increase the temperature of the power semiconductor module to the point of device failure. Power semiconductor devices are typically silicon based or silicon carbide (SiC) based. Silicon-based power semiconductors generally do not function beyond 150° C. SiC-based power semiconductors are able to function at much higher temperatures, as high as 250° C. They also have lower losses compared to their silicon-based counterparts and, as a result, SiC-based power semiconductors produce less heat. This combination of attributes means power semiconductor modules equipped with SiC-based power semiconductors should be able to function with smaller heat sinks and associated cooling systems, allowing the power semiconductor modules to be reduced in size and weight. However, thermal stresses resulting from cycling power semiconductor modules between on and off states, generally limit their operating temperature to 150° C. The thermal stresses result from the differences in coefficient of thermal expansion (CTE) between some of the power semiconductor module layers, such as copper and aluminum with CTE values of about $17 \times 10^{-6}/°$ C. and $25 \times 10^{-6}/°$ C., respectively, and AlN, $Al_2O_3$, silicon, and SiC with CTE values of about $4.3 \times 10^{-6}/°$ C., $7.3 \times 10^{-6}/°$ C., $3.2 \times 10^{-6}/°$ C., $4 \times 10^{-6}/°$ C., respectively. Failures modes include fracturing of the insulation substrate and delamination between layers with dramatically different CTEs. As a result, heat sinks and associated cooling systems cannot be fully reduced in size and weight to take advantage of the unique properties of SiC-based power semiconductors.

Recently, various configurations have been proposed using materials with CTE values that are significantly closer together to allow operation at temperatures approaching 200° C. However, none are able to closely match CTE values for all layers of a power semiconductor module to allow higher temperature operation, approaching 250° C., while reducing the weight of the power semiconductor module—an essential consideration for weight-sensitive applications, such as aircraft components.

SUMMARY

In one embodiment of the present invention, a power semiconductor module includes an insulating substrate with a conductive circuit layer attached to one side of the insulating substrate and a baseplate attached to the other side of the insulating substrate. A power semiconductor device is attached to the side of the conductive circuit layer not attached to the insulating substrate. The conductive circuit layer and the baseplate are formed of a material with a coefficient of thermal expansion less than about $8.0 \times 10^{-6}/°$ C. and a density less than about 4 g/cm$^3$.

Another embodiment of the present invention includes a method of configuring a power semiconductor module. A power semiconductor module conducts power to power semiconductor devices where the power is converted. Heat generated in the power semiconductor devices by the power conversion is conducted away from the power semiconductor devices first through a conductive circuit layer, then through an insulating substrate, to a baseplate where the heat is removed. The conductive circuit layer and the baseplate are formed of a material with a coefficient of thermal expansion less than about $8.0 \times 10^{-6}/°$ C. and a density less than about 4 g/cm$^3$.

DETAILED DESCRIPTION

Figure 1:
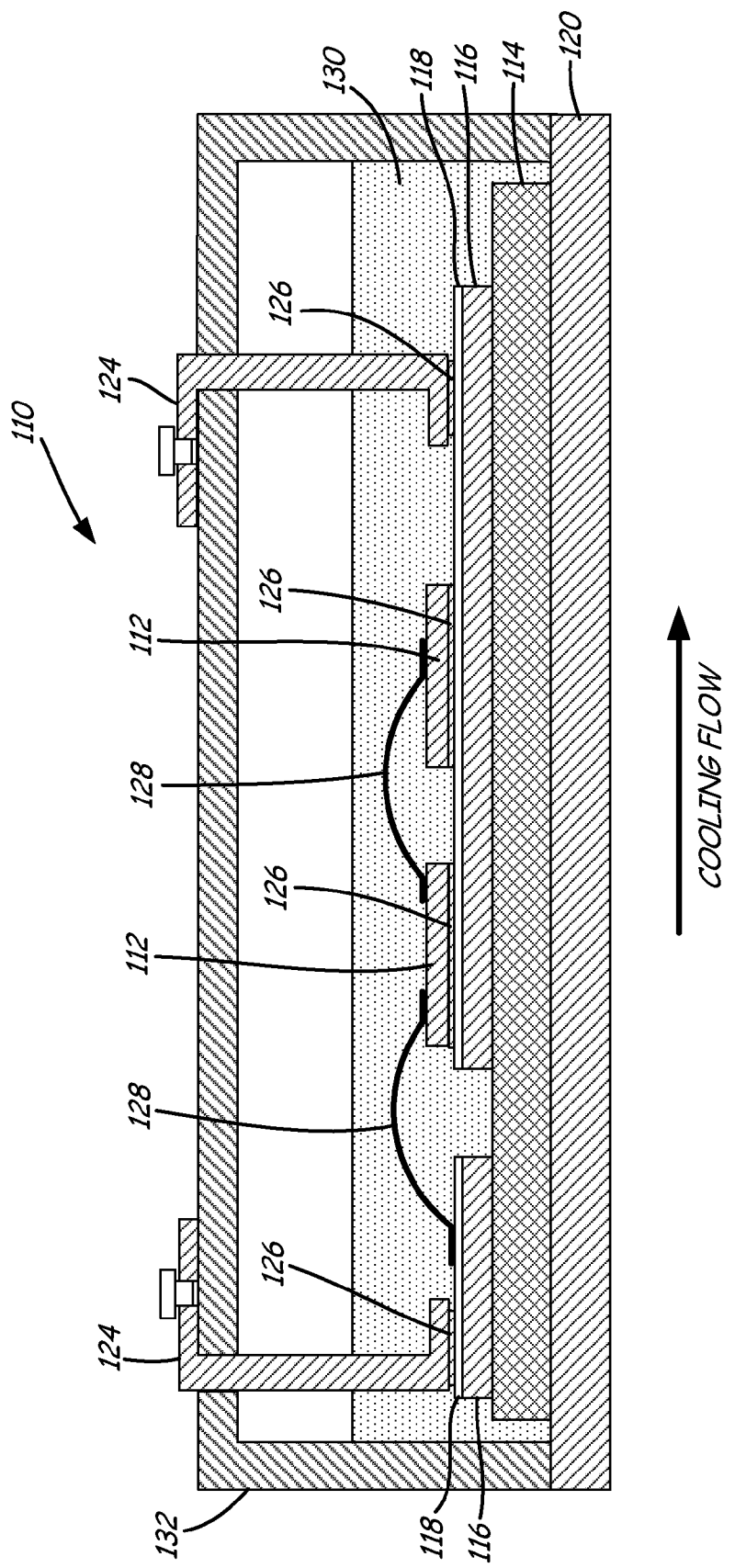
FIG. 1 is a cross-sectional view of a first embodiment of a power semiconductor module of the present invention.

FIG. 1 is a cross-sectional view of a first embodiment of a power semiconductor module of the present invention. FIG. 1 shows power semiconductor module 110, including a plurality of power semiconductor devices 112, insulating substrate 114, conductive circuit layer 116, solderability enhancing layer 118, and baseplate 120. Power semiconductor module 110 includes load current contacts 124, circuit contact solder connections 126, wires 128, soft casting compound 130, and plastic housing 132. Power semiconductor devices 112 are power semiconductor devices as described above and include SiC-based power semiconductor devices. Insulating substrate 114 is formed of a material that is electrically insulating and highly thermally conductive. Solderability enhancing layer 118 is formed of a material that is electrically conductive and compatible with solder attachment, for example, nickel.

Power semiconductor devices 112 are physically and electrically attached to conductive circuit layer 116 by circuit solder connections 126 and solderability enhancing layer 118. Conductive circuit layer 116 is bonded to a first side of insulating substrate 114. Baseplate 120 is bonded to a second side of insulating substrate 114 opposite the first side of insulating substrate 114. Baseplate 120 is in contact with a moving fluid, for example, air, cooling gas or liquid. Wires 128 connect power semiconductor devices 112 to each other and to sections of conductive circuit layer 116. Load current contacts 124 penetrate plastic housing 132 and are attached to conductive circuit layer 116 by circuit contact solder connections 126 and solderability enhancing layer 118. Plastic housing 132 is attached to baseplate 120. Soft casting compound 130 is applied to surround and contain power semiconductor devices 112, wires 128, conductive circuit layer 116, solderability enhancing layer 118, circuit solder connections 126, and insulating substrate 114. Soft casting compound 130 also contains a portion of load current contacts 124 and is held in place by plastic housing 132.

In operation, power is conducted through load current contacts 124 to conductive circuit layer 116 through circuit solder connections 126 and solderability enhancing layer 118. The power is converted or controlled by power semiconductor devices 112 functioning together through the interconnections provided by conductive circuit layer 116 and wires 128. Although solderability enhancing layer 118 may be coextensive and electrically in parallel with conductive circuit layer 116, as shown in FIG. 1, it is extremely thin compared to conductive circuit layer 116, so the vast majority of power is conducted through conductive circuit layer 116. Solderability enhancing layer 118 need not be either coextensive or electrically parallel with conductive circuit layer 116. Wires 128 are prevented from shorting to each other, to conductive circuit layer 116, or to load current contacts 124 by soft casting compound 130. Soft casting compound 130 also protects wires 128 from harmful vibration which, if unchecked, can cause failure of the connections between wires 128 and power semiconductor devices 112 and between wires 128 and conductive circuit layer 116.

Figure 2:
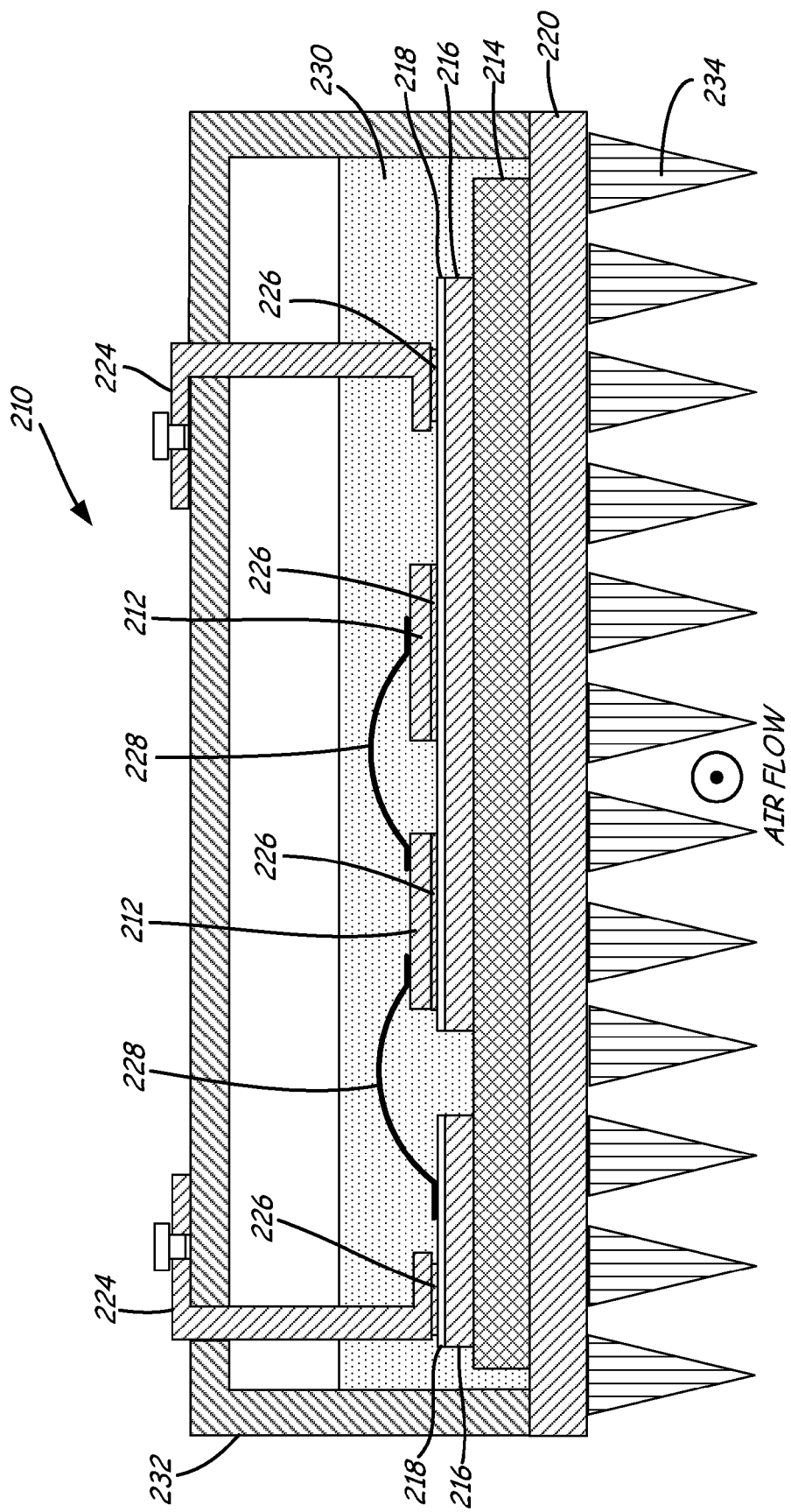
FIG. 2 is a cross-sectional view of a second embodiment of a power semiconductor module of the present invention.
Figure 3:
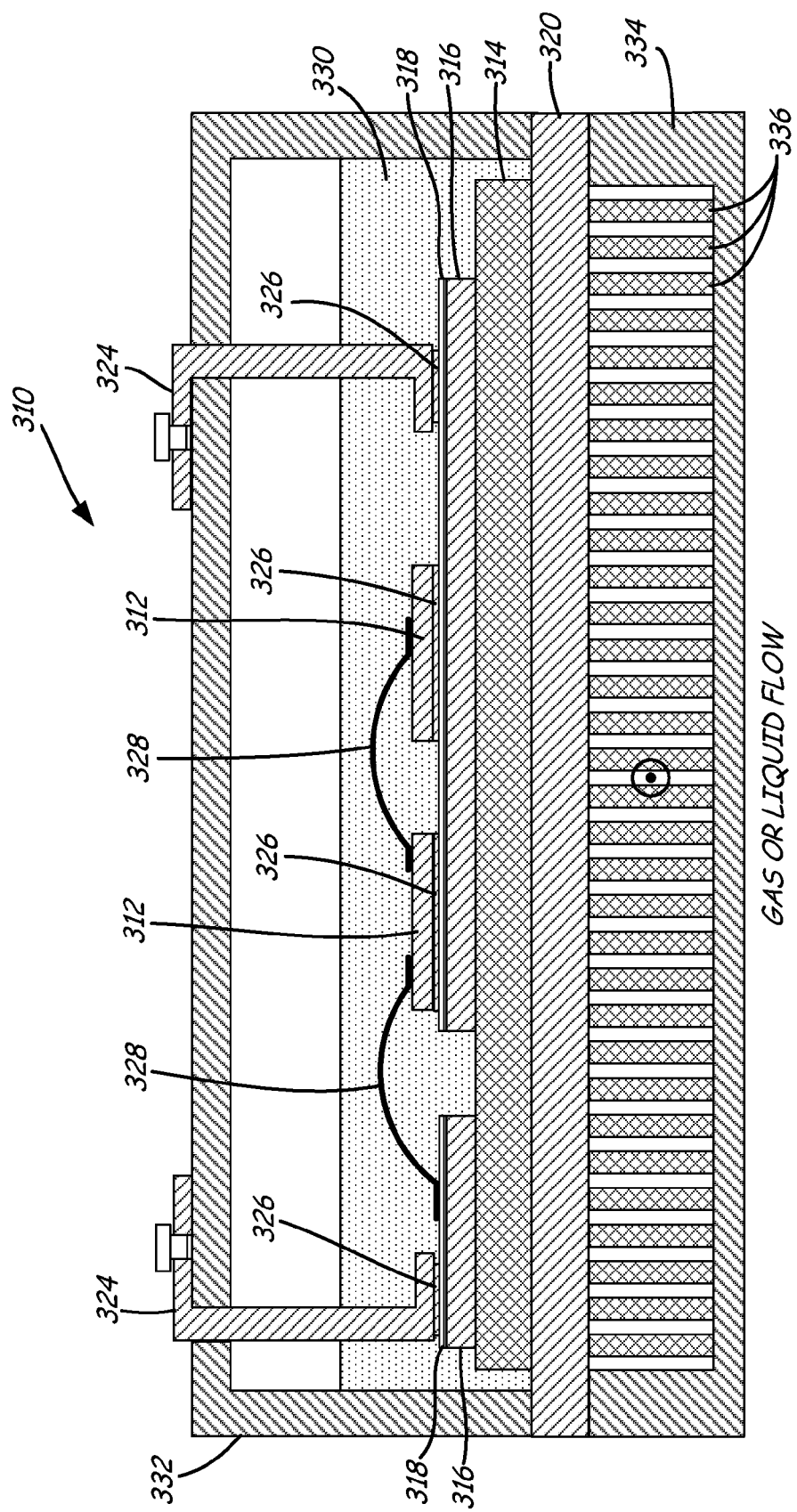
FIG. 3 is a cross-sectional view of a third embodiment of a power semiconductor module of the present invention.

Heat is generated by the power control and conversion process and must be conducted away from power semiconductor module 110 or the power semiconductor devices 112 will fail. Heat generated by power semiconductor devices 112 is conducted through conductive circuit layer 116 to insulating substrate 114 and then through insulating substrate 114 to baseplate 120. Baseplate 120 may be connected to a heat sink, as shown in FIGS. 2 and 3, or may itself be configured as a heat sink to conduct the heat away through physical contact with a fluid, including air, water and other coolants. Baseplate 120 also provides primary structural support for power semiconductor module 110.

All materials comprising the path for heat flow out of the device were selected for high thermal conductivity. In addition, in the present invention, the materials were chosen for their relatively low CTE values, less than about $8.0 \times 10^{-6}/°C$. These CTE values are close enough to that of the base material for power semiconductor devices 112, for example SiC, which has a CTE value of about $4.0 \times 10^{-6}/°C$., to eliminate failure from thermal stresses over an operating range of $-65°C$. to $250°C$. Finally, in the present invention, the materials are of low density, less than about $4.0 \text{ g/cm}^3$, so power module 110 is of light-weight construction. As mentioned above, insulation substrate 114 is a ceramic with high thermal conductivity, for example, aluminum nitride (AlN) or aluminum oxide ($Al_2O_3$). These ceramics also have low densities of about $3.3 \text{ g/cm}^3$ and about $3.9 \text{ g/cm}^3$, respectively and CTE values of about $4.3 \times 10^{-6}/°C$. and about $7.3 \times 10^{-6}/°C$., respectively.

Conductive circuit layer 116 is formed of a material that has a CTE less than about $8.0 \times 10^{-6}/°C$. and a density less than about $4 \text{ g/cm}^3$. The vast majority of materials in the prior art used for conductive circuit layers meet neither requirement. A power semiconductor module 110 with conductive circuit layer 116 made of copper, for example, with a CTE of about $17 \times 10^{-6}/°C$., is unlikely to survive cycling between temperature extremes without the succumbing to the temperature stresses between the copper layer and the attached insulation substrate 114 or power semiconductor device 112. In addition, copper is also very heavy with a density of about $9.0 \text{ g/cm}^3$. Another choice, aluminum, though not frequently used, is a better alternative: with a density of about $2.7 \text{ g/cm}^3$ it is light enough, but its CTE value of about $25 \times 10^{-6}/°C$. makes it even more likely than copper to fail cycling between temperature extremes due to thermal stresses. Tungsten, which is rarely, if ever, used in this application, is at the other extreme, with a suitable CTE value of about $4.6 \times 10^{-6}/°C$., but is far too heavy, with a density of about $19.3 \text{ g/cm}^3$.

One material that does meet all of the requirements is AlSiC. AlSiC has a suitable CTE value of about $7.5 \times 10^{-6}/°C$. and a density of about $3.0 \text{ g/cm}^3$. It is light and thermally compatible with the adjacent materials. AlSiC is not an obvious choice for conductive circuit layer 116 because, although it does conduct electricity, it does not do so nearly as well as the metals mentioned above. AlSiC has an electrical resistivity value of about $30 \times 10^{-8}$ $\Omega m$, while copper, aluminum, and tungsten have electrical resistivity values of about $1.7 \times 10^{-8}$ $\Omega m$, $2.7 \times 10^{-8}$ $\Omega m$, and $5.4 \times 10^{-8}$ $\Omega m$, respectively. However, in this application, the resistive losses and associated heat resulting from using a conductor with such a high electrical resistivity value are not significant when compared with the losses and heating that occur in the normal operation of the power semiconductor devices 112. The comparatively minor loss of efficiency is a small detriment for power semiconductor module 110 that is of light-weight construction and capable of withstanding the thermal stresses over an operating range of $-65°C$. to $250°C$. As a result, heat sinks and associated cooling systems can be fully reduced in size to take advantage of the unique properties of SiC-based power semiconductors.

Baseplate 120 is formed from a material that has a CTE less than about $8.0 \times 10^{-6}/°C$. has high thermal conductivity. As mentioned above, AlSiC meets both of these requirements, making it an excellent choice for baseplate 120. This leads to another advantage of using AlSiC for conductive circuit layer 116: because AlSiC is also an excellent material choice for baseplate 120, the same material is used on both sides of insulating substrate 114. Using the same material on both sides of insulating substrate 114 permits simultaneous fabrication of conductive circuit layer 116, insulating substrate 114, and baseplate 120 bonded together as a three-layer stack using high temperature processing. The three-layer stack resists warping that would otherwise result when the stack cools from the high process temperature, because the thermal stresses are equal, with AlSiC on both sides of insulating substrate 114. This ability to use high-temperature processes, such as, for example, diffusion bonding and near net-shape sintering, results in the formation of strong, durable bonds between the layers.

FIG. 2 is a cross-sectional view of a second embodiment of a power semiconductor module of the present invention with an attached heat sink suitable for cooling by air. FIG. 2 shows power semiconductor module 210, including a plurality of power semiconductor devices 212, insulating substrate 214, conductive circuit layer 216, solderability enhancing layer 218, and baseplate 220. Power semiconductor module 210 includes load current contacts 224, circuit contact solder connections 226, wires 228, soft casting compound 230, and plastic housing 232. In description, connection and function, components 212 through 232 are as described for comparable components 112 through 132 of FIG. 1.

FIG. 2 further comprises heat sink 234. Heat sink 234 is attached to baseplate 220 on the side opposite insulating substrate 214. Heat sink 234 is fabricated such that the surface opposite the side attached to baseplate 220 has a large surface area. Heat generated by power semiconductor devices 212 is conducted through conductive circuit layer 216 to insulating substrate 214 and then through insulating substrate 214 to baseplate 220. The heat is conducted from baseplate 220 to heat sink 234. In operation, the side of heat sink 234 with a large surface area is in contact with flowing air. Air flows past the large surface area of heat sink 234 and carries away the heat, cooling power semiconductor module 210. Air flow may be by natural convection or, for improved cooling, by forced convection.

Heat sink 234 must be formed from a material having good thermal conductivity and low density, for example, aluminum. Attachment of heat sink 234 to baseplate 220 may be done by any of several methods, including brazing and soldering. This embodiment shares all of the advantages of the embodiment described in FIG. 1, and in addition, it can control or convert larger amounts of power because heat generated by the power control and conversion process is more efficiently conducted away from power semiconductor module 210.

FIG. 3 is a cross-sectional view of a third embodiment of a power semiconductor module of the present invention with an attached heat sink suitable for cooling by gas or liquid. FIG. 3 shows power semiconductor module 310, including a plurality of power semiconductor devices 312, insulating substrate 314, conductive circuit layer 316, solderability enhancing layer 318, and baseplate 320. Power semiconductor module 310 includes load current contacts 324, circuit contact solder connections 326, wires 328, soft casting compound 330, and plastic housing 332. In description, connection and function, components 312 through 332 are as described for comparable components 112 through 132 of FIG. 1.

FIG. 3 further comprises heat sink 334. Heat sink 334 is attached to baseplate 320 on the side opposite insulating substrate 314. Heat sink 334 is fabricated such that the surface opposite the side attached to baseplate 320 has a large, enclosed surface area 336. Heat generated by power semiconductor devices 312 is conducted through conductive circuit layer 316 to insulating substrate 314 and then through insulating substrate 314 to baseplate 320. The heat is conducted from baseplate 320 to heat sink 334. In operation, large, enclosed surface area 336 is in contact with flowing gas or liquid. Gas or liquid flows past the large, enclosed surface area 336 of heat sink 334 and carries away the heat, cooling power semiconductor module 310. The gas or liquid must be contained to prevent mixing with air and loss of the cooling gas or liquid. The gas or liquid has a high heat capacity, such as, for example, helium and hydrogen gases and water and ethylene glycol liquids.

Heat sink 334 must be formed from a material having good thermal conductivity and low density, for example, aluminum. Attachment of heat sink 334 to baseplate 320 may be done by any of several methods, including brazing and soldering. This embodiment shares all of the advantages of the embodiment described in FIG. 2, and in addition, it can control or convert still larger amounts of power because heat generated by the power control and conversion process is more efficiently conducted away from power semiconductor module 310.

The present invention takes full advantage of the unique capabilities of SiC-based power semiconductor devices to create a power semiconductor module of light-weight construction, with heat sinks and associated cooling systems greatly reduced in size and weight. The use of AlSiC for the conductive circuit layer and the baseplate creates a power semiconductor module with low thermal stresses over an extended operating temperature range that would cause device failure in conventional designs. In addition, the three-layer stack of AlSiC/AlN/AlSiC is suitable for simultaneous high-temperature processing, permitting the use of diffusion bonding and near net-shape sintering to form strong, durable bonds between the three layers. Finally, the use of AlSiC, with its low density, for the conductive circuit layer and the baseplate creates a power semiconductor module of light-weight construction, suitable for weight sensitive applications such as power conversion on an aircraft.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:
1. A power semiconductor module comprising:
an electrically insulating substrate;
a baseplate attached to a first side of the electrically insulating substrate;
a conductive layer directly attached to a second side of the electrically insulating substrate opposite the first side of the electrically insulating substrate; and
a power semiconductor device physically and electrically attached to a side of the conductive layer not attached to the electrically insulating substrate;
wherein the baseplate and the conductive layer are formed of a material with a coefficient of thermal expansion less than about $8.0 \times 10^{-6}/°$ C. and a density less than about 4 $g/cm^3$.

2. The power semiconductor module of claim 1 wherein the conductive layer is a patterned circuit layer.

3. The power semiconductor module of claim 1 further comprising a solderability-enhancing layer between the conductive layer and the power semiconductor device.

4. The power semiconductor module of claim 3, wherein the solderability-enhancing layer is a metal layer.

5. The power semiconductor module of claim 4, wherein the metal layer is nickel.

6. The power semiconductor module of claim 1, wherein the electrically insulating substrate is a ceramic.

7. The power semiconductor module of claim 6, wherein the ceramic comprises at least one of aluminum nitride and aluminum oxide.

8. The power semiconductor module of claim 1, wherein the material forming the baseplate and the conductive layer is aluminum silicon carbide.

9. The power semiconductor module of claim 1, further comprising a heat sink, wherein the heat sink is attached to a side of the baseplate not attached to the electrically insulating substrate.

10. The power semiconductor module of claim 9, wherein the heat sink is cooled by a gas.

11. The power semiconductor module of claim 9, wherein the heat sink is cooled by a liquid.

12. A power semiconductor module comprising:
an electrically insulating substrate;
a baseplate attached to a first side of the electrically insulating substrate;
a conductive circuit layer directly attached to a second side of the electrically insulating substrate opposite the first side of the electrically insulating substrate; and
a power semiconductor device physically and electrically attached to a side of the conductive circuit layer not attached to the electrically insulating substrate;
wherein the baseplate and the conductive circuit layer are formed of a material with a coefficient of thermal expansion less than about $8.0 \times 10^{-6}/°$ C. and a density less than about 4 $g/cm^3$.

13. The power semiconductor module of claim 12, wherein the electrically insulating substrate comprises at least one of aluminum nitride and aluminum oxide.

14. The power semiconductor module of claim 12, wherein the material forming the baseplate and the conductive circuit layer is aluminum silicon carbide.

15. The power semiconductor module of claim 12, further comprising a heat sink, wherein the heat sink is attached to a side of the baseplate not attached to the electrically insulating substrate.

16. The power semiconductor module of claim 12, wherein the baseplate is configured as a heat sink, and wherein the baseplate is cooled by a moving fluid.

* * * * *